(12) United States Patent
Honjo et al.

(10) Patent No.: US 8,975,667 B2
(45) Date of Patent: Mar. 10, 2015

(54) SOLID-STATE IMAGING DEVICE, ELECTRONIC EQUIPMENT AND MANUFACTURING METHOD OF THE SOLID-STATE IMAGING DEVICE

(75) Inventors: Akiko Honjo, Kanagawa (JP); Shinya Yamakawa, Kanagawa (JP)

(73) Assignee: Sony Corporation (JP)

( * ) Notice: Subject to any disclaimer, the term of this patent is extended or adjusted under 35 U.S.C. 154(b) by 106 days.

(21) Appl. No.: 13/618,765

(22) Filed: Sep. 14, 2012

(65) Prior Publication Data

US 2013/0099094 A1    Apr. 25, 2013

Related U.S. Application Data

(62) Division of application No. 12/712,846, filed on Feb. 25, 2010, now abandoned.

(30) Foreign Application Priority Data

Mar. 9, 2009    (JP) ................................. 2009-054353

(51) Int. Cl.
*H01L 31/00* (2006.01)
*H01L 31/113* (2006.01)
*H01L 27/146* (2006.01)

(52) U.S. Cl.
CPC ...... *H01L 31/1136* (2013.01); *H01L 27/14609* (2013.01); *H01L 27/1463* (2013.01); *H01L 27/146* (2013.01); *H01L 27/14612* (2013.01)
USPC ............................ 257/215; 257/219; 257/292

(58) Field of Classification Search
CPC .............. H01L 31/1136; H01L 27/146; H01L 27/1463
USPC ............................ 257/215, 219, 292, E31.073
See application file for complete search history.

(56) References Cited

U.S. PATENT DOCUMENTS

| 7,388,187 | B1 | 6/2008 | Liu et al. | |
|---|---|---|---|---|
| 2006/0170018 | A1 | 8/2006 | Kuriyama | |
| 2006/0226438 | A1 | 10/2006 | Katsuno | |
| 2007/0045668 | A1 | 3/2007 | Brady | |
| 2007/0262241 | A1 | 11/2007 | Inoue | |
| 2008/0006892 | A1* | 1/2008 | Ura et al. | ...................... 257/431 |

FOREIGN PATENT DOCUMENTS

| EP | 1 746 655 A2 | 1/2007 |
|---|---|---|
| JP | 2000-299453 | 10/2000 |
| JP | 2001-053260 A | 2/2001 |

OTHER PUBLICATIONS

European Search Report dated Apr. 24, 2012 for EP Application No. 10001286.3-1235 / 2228825.
Communication from European Patent Office dated Jun. 5, 2012 for EP Application No. 10001286.3-1235.

* cited by examiner

*Primary Examiner* — Tran Tran
(74) *Attorney, Agent, or Firm* — Sheridan Ross P.C.

(57) ABSTRACT

A solid-state imaging device including, active elements configured to handle the charge captured in a photoreceiving region, an element isolation region configured to isolate regions of the active element, a first impurity region configured to surround the element isolation region, and a second impurity region including an impurity region lower in impurity concentration than the first impurity region, the second impurity region being provided between the first impurity region and active elements.

8 Claims, 9 Drawing Sheets

F I G . 1
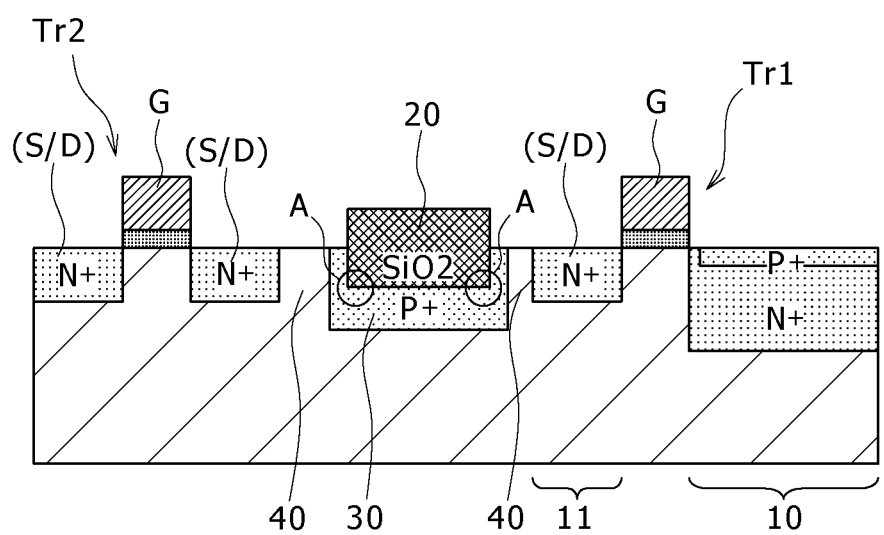

SOLID-STATE IMAGING DEVICE, ELECTRONIC EQUIPMENT AND MANUFACTURING METHOD OF THE SOLID-STATE IMAGING DEVICE

CROSS-REFERENCE TO RELATED APPLICATIONS

This application is a division of U.S. application Ser. No. 12/712,846, entitled "SOLID-STATE IMAGING DEVICE, ELECTRONIC EQUIPMENT AND MANUFACTURING METHOD OF THE SOLID-STATE IMAGING DEVICE," filed on Feb. 25, 2010 now abandoned, the entirety of which is incorporated herein by reference to the extent permitted by law. The present invention claims priority to Japanese Patent Application No. 2009-054353, filed Mar. 9, 2009, the entirety of which is also incorporated herein by reference to the extent permitted by law.

BACKGROUND OF THE INVENTION

1. Field of the Invention

The present invention relates to a solid-state imaging device, electronic equipment having the same and manufacturing method of the same. The present invention relates more specifically to a solid-state imaging device for suppressing the leak current in active elements adapted to handle the charge captured in a photoreceiving region, electronic equipment having the same and manufacturing method of the same.

2. Description of the Related Art

A number of CMOS (Complementary Metal Oxide Semiconductor) or MOS (Metal Oxide Semiconductor) solid-state imaging elements are incorporated in digital cameras, video camcorders, copiers, camera-equipped mobile phones and other equipment. These solid-state imaging elements tend to be miniaturized and grow in pixel count, with the photo diode area also showing a decreasing tendency. This reduces the amount of signal charge, thus making it necessary to suppress the leak current in the photodiode, floating diffusion and reset transistor for minimal noise.

In general, defects are abundant in the interface between the oxide film and silicon substrate. If a PN junction is formed in this interface, a leak current is generated. This current is dependent on an electric field which develops in the PN junction via the defects in the interface. At the end portion of the oxide film forming an element isolation region in particular, crystal defects occur due to stress. As a result, if a PN junction is formed where this stress concentrates, a large leak current will be generated. For this reason, a configuration is disclosed in Japanese Patent Laid-Open No. 2000-299453 in which the interface of the element isolation region is covered with a P type semiconductor layer.

SUMMARY OF THE INVENTION

In the technique hitherto known, although no strong electric field region is formed in the interface of the element isolation region, high concentration P and N type semiconductors come in contact with each other in a PN junction formed with a P type well region outside the element isolation region and an N type region of the adjacent element. This leads to a steep concentration gradient of the PN junction, resulting in a strong electric field in the PN junction. Further, a PN junction with a steep concentration gradient is formed in the interface of the oxide film in a transistor region, making it impossible to suppress the increase in leak current.

It is an embodiment of the present invention to suppress the leak current in active elements adapted to handle the charge captured in a photoreceiving region.

According to an embodiment of the present invention there are provided a solid-state imaging device and electronic equipment having the solid-state imaging device. The solid-state imaging device includes active elements, element isolation region and first and second impurity regions. The active elements handle the charge captured in a photoreceiving region. The element isolation region isolates the regions of the active elements. The first impurity region surrounds the element isolation region. The second impurity region includes an impurity region lower in impurity concentration than the first impurity region. The second impurity region is provided between the first impurity region and active elements.

In an embodiment of the present invention, the element isolation region is surrounded by the first impurity region. This suppresses the leak current in crystal defects caused by stress concentration in the interface of the element isolation region. Further, the second impurity region is provided between the first impurity region and active elements. This provides a less steep concentration gradient than if the active elements and first impurity region were adjacent to each other.

Here, the active elements are transistors. A third impurity region is provided around at least either of the source and drain of the transistor. This provides an even less steep concentration gradient between at least either of the source and drain of the transistor and the element isolation region.

According to another embodiment of the present invention there is provided a manufacturing method of a solid-state imaging device. The manufacturing method includes steps of forming an impurity region around active element forming regions and forming an element isolation region inside the impurity region, and forming a mask having an opening inside the active element forming regions and doping the active element forming regions with an impurity to form active elements.

In the embodiment of the present invention as described above, the element isolation region is surrounded by the impurity region. This suppresses the leak current in crystal defects caused by stress concentration in the interface of the element isolation region. Further, a spacing is provided between the impurity region and active elements. This provides a less steep concentration gradient than if the active elements and first impurity region were adjacent to each other.

The embodiments of the present invention contributes to suppression of the leak current in active elements adapted to handle the charge captured in a photoreceiving region, thus suppressing visual perception of a white spot defect in a photoreception signal.

BRIEF DESCRIPTION OF THE DRAWINGS

FIG. 1 is a schematic sectional diagram for describing a solid-state imaging device (first configuration) according to the present embodiment;

DETAILED DESCRIPTION OF THE PREFERRED EMBODIMENT

Figure 2:
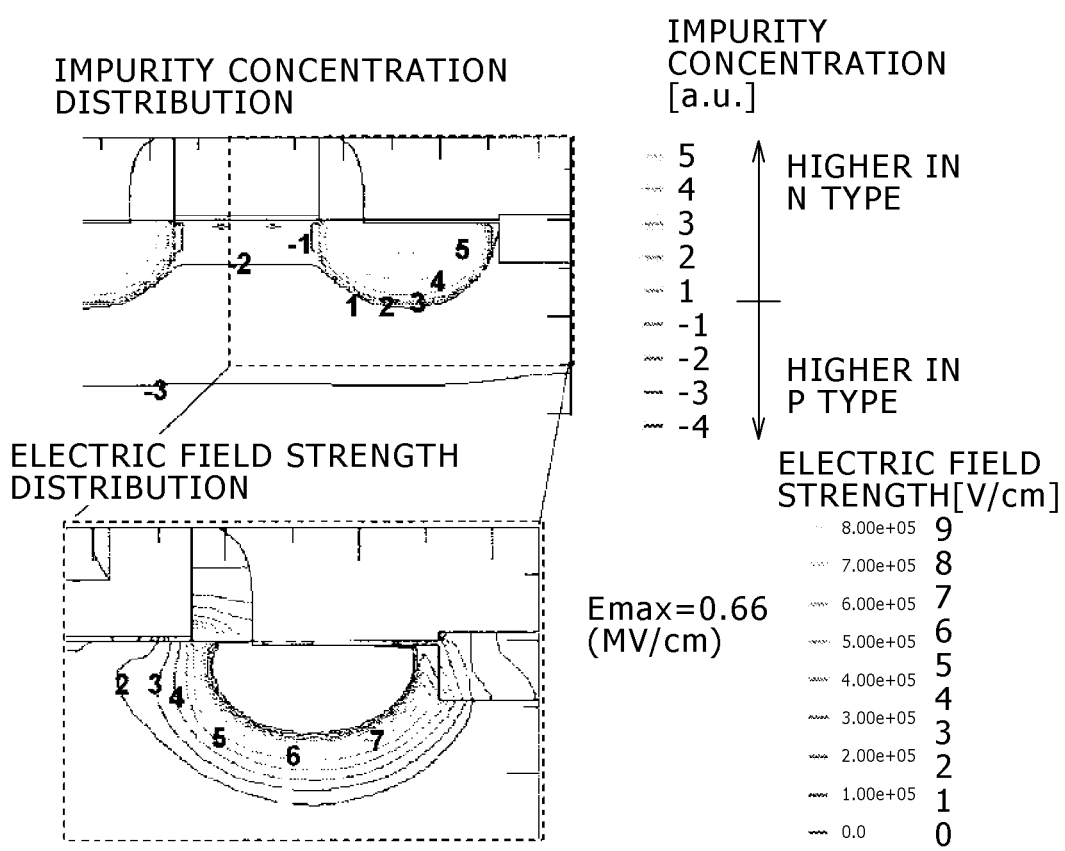
FIG. 2 is diagrams illustrating an example of impurity concentration distribution and electric field strength distribution with a bias applied in the configuration of the solid-state imaging device according to the present embodiment shown in FIG. 1.

A description will be given below of a mode for carrying out the present invention (hereinafter referred to as an embodiment). It should be noted that the description will be given in the following order:

1. Configurations of the solid-state imaging device (examples of the first and second configurations)
2. Manufacturing method of the solid-state imaging device
3. Electronic equipment <1. Configurations of the Solid-State Imaging Device>

[First Configuration]

FIG. 1 is a schematic sectional diagram for describing the solid-state imaging device (first configuration) according to the present embodiment. The solid-state imaging device according to the present embodiment is formed in a semiconductor substrate or other semiconductor material. The solid-state imaging device includes active elements and an element isolation region 20. The active elements handle the charge captured in a photoreceiving region 10. The element isolation region 20 isolates active element regions.

Here, the active elements are a transfer transistor Tr1, reset transistor Tr2 and other transistors adjacent to the photoreceiving region 10. The transfer transistor Tr1 is adjacent to a charge-to-voltage conversion section (floating diffusion) 11 adapted to convert the charge captured in the photoreceiving region 10 to a voltage. The transfer transistor Tr1 transmits the charge to the charge-to-voltage conversion section 11. The reset transistor Tr2 discharges the charge transmitted to the charge-to-voltage conversion section 11.

The photoreceiving region 10 is a photodiode which includes N+ and P+ type regions formed in the semiconductor material. The photoreceiving region 10 generates the charge according to the amount of light received. The charge-to-voltage conversion section 11 provided adjacent to the photoreceiving region 10 is a doped section adapted to convert the charge generated by the photoreceiving region 10 to a voltage and output the voltage as a photoreception signal. The transfer transistor Tr1 is provided between the photoreceiving region 10 and charge-to-voltage conversion section 11. When a given voltage is applied to a gate electrode (transfer electrode) G of the transfer transistor Tr1, the charge is read from the photoreceiving region 10 and transmitted to the charge-to-voltage conversion section 11.

The reset transistor Tr2 and transfer transistor Tr1 are isolated from each other by the element isolation region 20 provided therebetween. The reset transistor Tr2 discharges the charge transmitted to the charge-to-voltage conversion section 11. That is, when a given charge is applied to the gate electrode G of the reset transistor Tr2, the charge-to-voltage conversion section 11 is discharged via the reset transistor Tr2.

In the solid-state imaging device according to the present embodiment, a P+ type region is provided as a first impurity region 30 around the element isolation region 20. Further, a second impurity region 40 is provided between the first impurity region 30 and active elements. The second impurity region 40 includes a P− type region lower in impurity concentration than the first impurity region 30. This provides a less steep concentration gradient between the source/drain regions (S/D) of the active elements and the first impurity region 30 around the element isolation region 20 than if the active elements and first impurity region 30 were adjacent to each other.

That is, each of the source and drain regions of the active elements is provided as an N+ impurity region. The second impurity region including a P− type region is provided between the source or drain region and the first impurity region including a P+ type region. Therefore, the P− type region lies between the N+ type region, i.e., source or drain region, and the P+ type region, i.e., first impurity region. This provides a less steep concentration gradient than if the drain region (N+ type region) and first impurity region (P+ type region) were adjacent to each other.

FIG. 2 is diagrams illustrating an example of impurity concentration distribution and electric field strength distribution with a bias applied in the configuration of the solid-state imaging device according to the present embodiment shown in FIG. 1. The upper diagram illustrates the impurity concentration distribution, and the lower diagram the electric field strength distribution. In the example shown here, the doped region forming the transistor source region is spaced from the element isolation region by 100 nm. In the impurity concentration distribution shown in the upper diagram, positive values on the scale from −4 to 5 denote N type regions, and negative values P type regions. The larger the value is, irrespective of whether it is positive or negative, the higher the impurity concentration. Further, in the electric field strength distribution shown in the lower diagram, the larger the value is on the scale from 0 to 9, the higher the electric field strength.

In the configuration of the solid-state imaging device according to the present embodiment, the defect-prone end portions of the element isolation region subject to stress concentration (portions A in FIG. 1) are covered with the first impurity region including a P type region. Moreover, the concentration gradient of the PN junction is less steep, thus relaxing the electric field.

Figure 9:
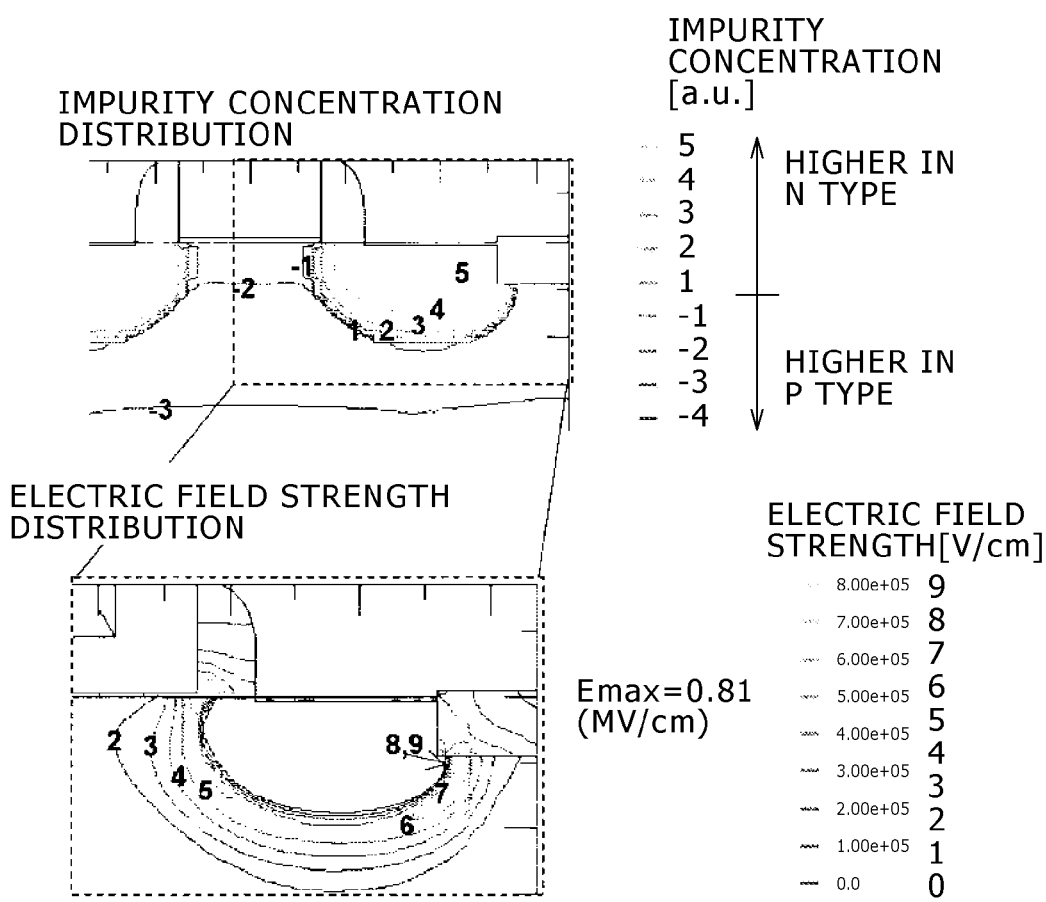
FIG. 9 is diagrams illustrating an example of impurity concentration distribution and electric field strength distribution with a bias applied in the configuration of a comparative example.

Here, a comparative example of impurity concentration distribution and electric field strength distribution is shown in FIG. 9 in which the element isolation region is not surrounded by the first impurity region. In the structure of the comparative example, the concentration gradient of the PN junction at the end portions in the element isolation region is steeper than in the present embodiment. As a result, the maximum electric field strength is 0.81 MV/cm. As illustrated in FIG. 2, on the other hand, the maximum electric field strength is 0.66 MV/cm in the configuration of the solid-state imaging device according to the present embodiment.

Figure 5:
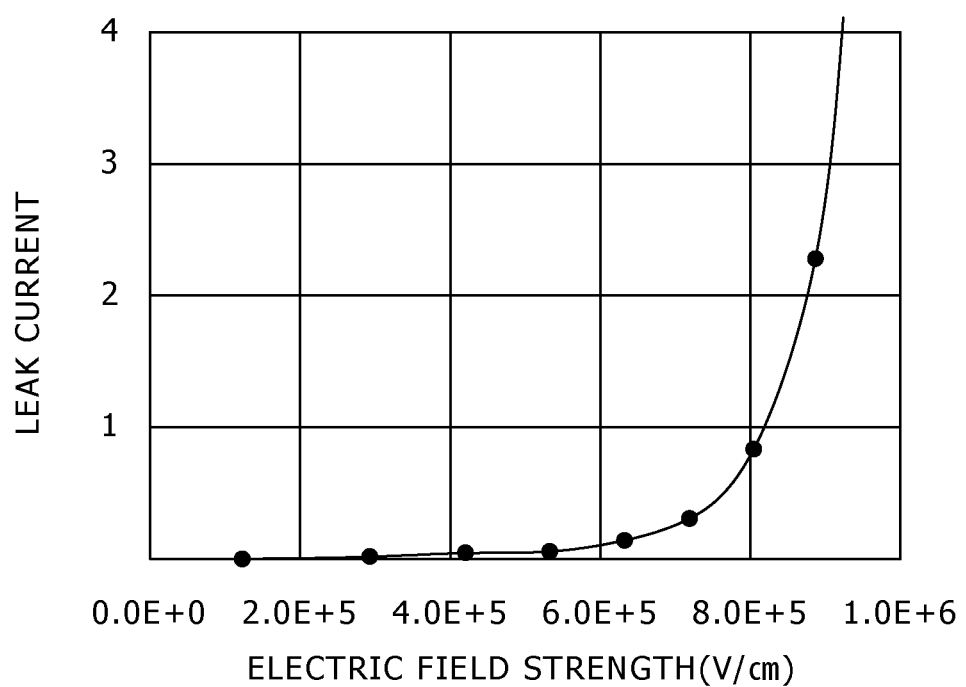
FIG. 5 is a diagram illustrating the relationship between the electric field strength and leak current.

FIG. 5 is a diagram illustrating the relationship between the electric field strength and leak current. This diagram has been produced by converting the relationship between and electric field strength based on the Shockley-Read-Hall's TAT model into that between the leak current and electric field strength. In the diagram, the horizontal axis represents the electric field strength, and the vertical axis represents the leak current (relative value). According to this diagram, the electric field strength drops from 0.81 MV/cm for the configuration of the comparative example to 0.66 MV/cm for the configuration according to the present embodiment. As a result, the leak current diminishes to approximately one seventh (1/7).

[Second Configuration]

Figure 3:
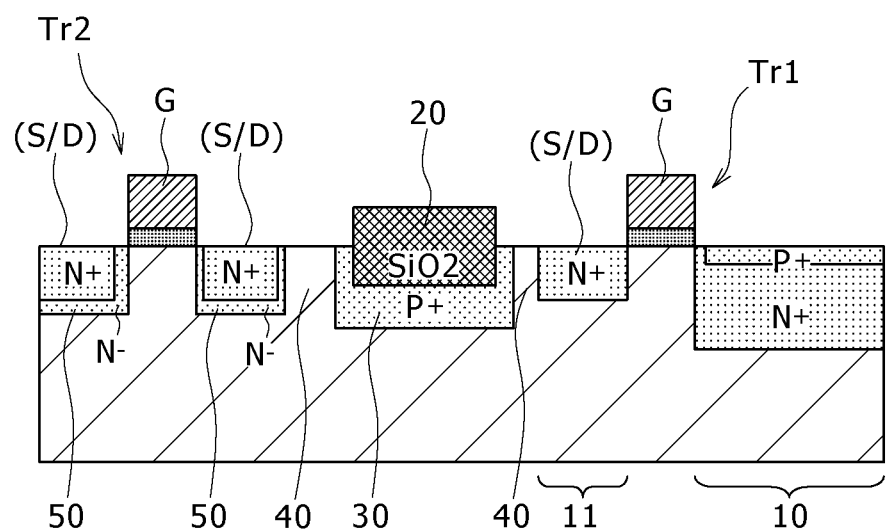
FIG. 3 is a schematic sectional view for describing the solid-state imaging device (second configuration) according to the present embodiment.

FIG. 3 is a schematic sectional view for describing the solid-state imaging device (second configuration) according to the present embodiment. The solid-state imaging device according to the present embodiment is formed in a semiconductor material as with the first configuration. The solid-state imaging device also includes active elements and the element isolation region 20. The active elements handle the charge captured in the photoreceiving region 10. The element isolation region 20 isolates the active element regions.

Here, the active elements are the transfer transistor Tr1, reset transistor Tr2 and other transistors adjacent to the photoreceiving region 10. The transfer transistor Tr1 is adjacent to the charge-to-voltage conversion section (floating diffusion) 11 adapted to convert the charge captured in the photoreceiving region 10 to a voltage. The transfer transistor Tr1 transmits the charge to the charge-to-voltage conversion section 11. The reset transistor Tr2 discharges the charge transmitted to the charge-to-voltage conversion section 11.

The photoreceiving region 10 is a photodiode which includes N+ and P+ type regions formed in the semiconductor material. The photoreceiving region 10 generates the charge according to the amount of light received. The charge-to-voltage conversion section 11 provided adjacent to the photoreceiving region 10 converts the charge generated by the photoreceiving region 10 to a voltage and outputs the voltage as a photoreception signal. The transfer transistor Tr1 is provided between the photoreceiving region 10 and charge-to-voltage conversion section 11. When a given voltage is applied to the gate electrode (transfer electrode) G of the transfer transistor Tr1, the charge is read from the photoreceiving region 10 and transmitted to the charge-to-voltage conversion section 11.

The reset transistor Tr2 and transfer transistor Tr1 are isolated from each other by the element isolation region 20 provided therebetween. The reset transistor Tr2 discharges the charge transmitted to the charge-to-voltage conversion section 11. That is, when a given charge is applied to the gate G of the reset transistor Tr2, the charge-to-voltage conversion section 11 is discharged via the reset transistor Tr2.

In the solid-state imaging device according to the present embodiment, a P+ type region is provided as the first impurity region 30 around the element isolation region 20. Further, the second impurity region 40 is provided between the first impurity region 30 and active elements. The second impurity region 40 includes a P− type region lower in impurity concentration than the first impurity region 30. Further, in the second configuration, a third impurity region 50 is provided around at least one of the source/drain regions (S/D) of the transistor, i.e., active element. The third impurity region 50 is of the same conductivity type as and lower in impurity concentration than the source/drain regions (S/D).

In the example illustrated in FIG. 3, the third impurity region 50 is provided around the source/drain regions (S/D) of the reset transistor Tr2. The third impurity region 50 includes an N-type region lower in impurity concentration than the N+ impurity region, i.e., source/drain regions (S/D). The third impurity region 50 is not provided for the transfer transistor Tr1. However, the third impurity region 50 may be provided for the transfer transistor Tr1 as necessary.

As described above, if the source/drain region (S/D) of the transistor is surrounded by the third impurity region 50, the impurity concentration gradient from the source/drain region (S/D) to the first impurity region 30 around the element isolation region 20 can be made less steep than in the first configuration. This relaxes the electric field further, thus contributing to reduced leak current.

Figure 4:
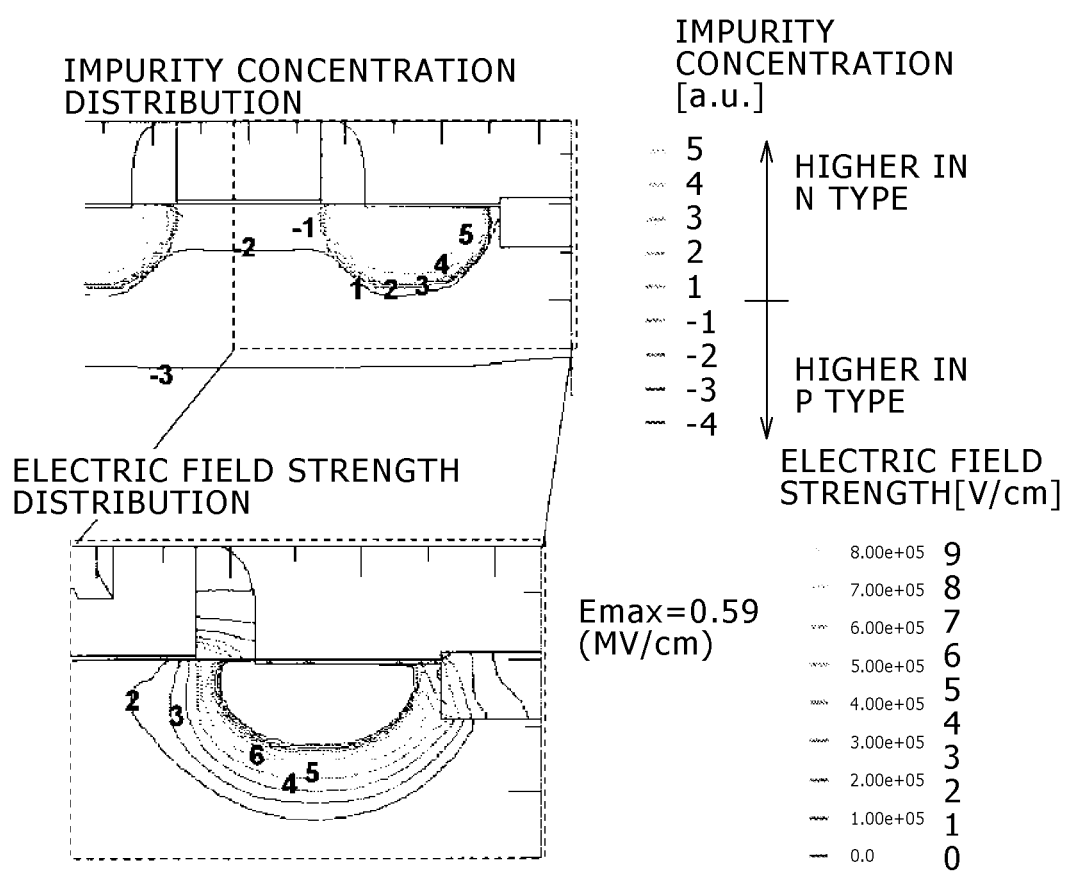
FIG. 4 is diagrams illustrating an example of impurity concentration distribution and electric field strength distribution with a bias applied in the configuration of the solid-state imaging device according to the present embodiment shown in FIG. 3.

FIG. 4 is diagrams illustrating an example of impurity concentration distribution and electric field strength distribution with a bias applied in the configuration of the solid-state imaging device according to the present embodiment shown in FIG. 3. The upper diagram illustrates the impurity concentration distribution, and the lower diagram illustrates the electric field strength distribution. In the example shown here, the doped region forming the transistor source region is spaced from the element isolation region by 100 nm. In the impurity concentration distribution shown in the upper diagram, positive values on the scale from −4 to 5 denote N type regions, and negative values P type regions. The larger the value is, irrespective of whether it is positive or negative, the higher the impurity concentration. Further, in the electric field strength distribution shown in the lower diagram, the larger the value is on the scale from 0 to 9, the higher the electric field strength.

In the configuration of the solid-state imaging device according to the present embodiment, the defect-prone end portions of the element isolation region subject to stress concentration are covered with the first impurity region including a P type region. Moreover, the concentration gradient of the PN junction is less steep than in the first configuration (FIG. 1), thus relaxing the electric field. This brings the maximum electric field strength down to 0.59 MV/cm. As a result, according to the relationship between the electric field strength and leak current shown in FIG. 5, the leak current of the solid-state imaging device according to the present embodiment diminishes to approximately one eighth (1/8) of the comparative example (refer to FIG. 9).

<2. Manufacturing Method of the Solid-State Imaging Device>

Figure 6A:
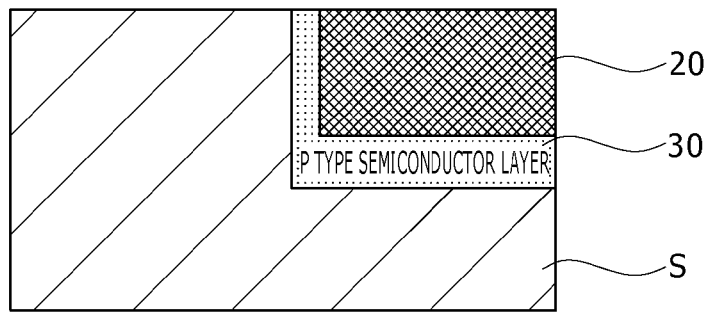
FIGS. 6A to 6C are schematic diagrams (1) for describing an example of a manufacturing method of the solid-state imaging device according to the present embodiment.

FIGS. 6A to 6C and FIG. 7 are schematic diagrams for describing an example of a manufacturing method of the solid-state imaging device according to the present embodiment. First, as illustrated in FIG. 6A, the element isolation region 20 is formed on a semiconductor substrate S. A silicon (Si) substrate, for example, is used as the semiconductor substrate S. The element isolation region 20 is formed in a LOCOS (Local Oxidation of Silicon) or STI (Shallow Trench Isolation) structure which includes, for example, an insulating layer (SiO2).

Here, before or after the element isolation region 20 shown in FIG. 6A is formed, the first impurity region 30, i.e., P type semiconductor layer, is formed to surround the element isolation region 20. Although not illustrated, the element isolation region 20 and first impurity region 30 are provided to surround the transistor forming region.

Figure 6B:
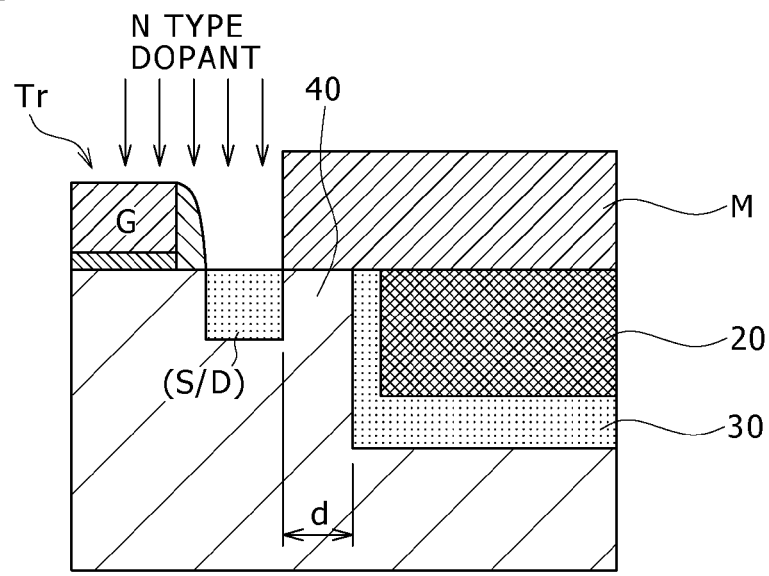
Figure 6C:
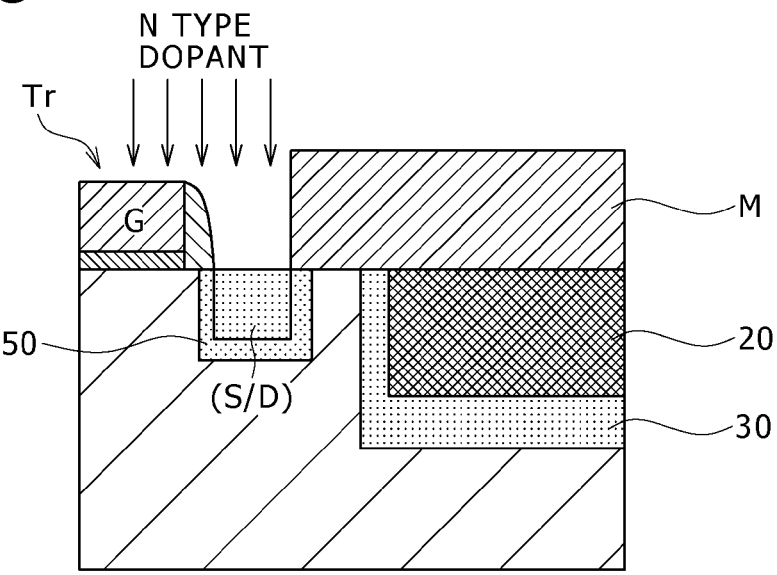

Next, as illustrated in FIG. 6B, a channel making up a transistor Tr is formed on the semiconductor substrate S. Next, the gate electrode G is formed with a gate insulating film disposed between the channel and gate electrode G. Then, one or both of the source/drain regions (S/D) are doped with an N type impurity. At the time of doping, the size of the opening of the insulating film used as a mask M is made smaller than that of the region surrounded by the first impurity region 30 of the element isolation region 20. For example, the edge of the opening of the mask M is spaced by a distance d of 50 nm or more from the end portion of the first impurity region 30.

Figure 7:
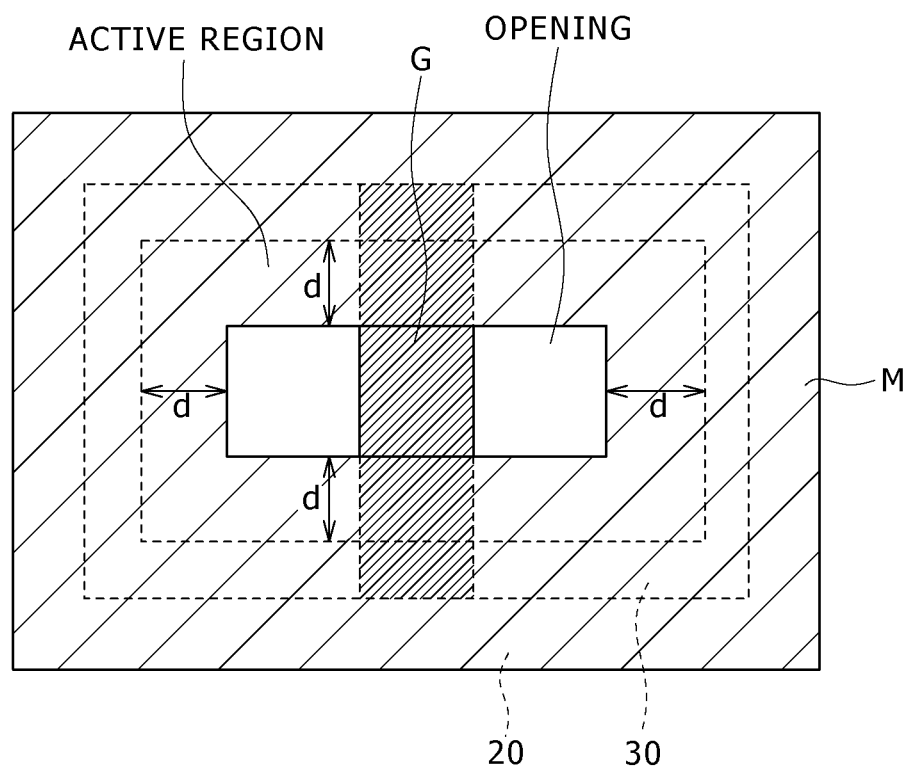
FIG. 7 is a schematic diagram (2) for describing an example of a manufacturing method of the solid-state imaging device according to the present embodiment.

FIG. 7 illustrates the mask layout during doping of the source and drain regions. The first impurity region 30 around the element isolation region 20 is formed to surround an active region. The gate electrode G is formed inside the active region. The source and drain regions are formed in a self-aligned manner with respect to the gate electrode G as a result of the doping via the gate electrode G.

Further, in the present embodiment, the mask M is formed inside the active region surrounded by the first impurity region 30 of the element isolation region 20. That is, the position of the opening is determined so that the distance d between the edge of the opening of the mask M and the end portion of the first impurity region 30 (end portion of the active region) is 50 nm or more as described above. Doping via the mask M and gate electrode G allows for the source and drain regions to be formed in such a manner as to be spaced from the first impurity region 30 of the element isolation region 20.

Here, the doping conditions for forming the source and gate regions are, for example, arsenic or phosphorus as ion species, 10 to 20 keV as energy and $5 \times 10^{14}$ cm$^2$ or more as dose.

Further, by repeating the doping step a plurality of times with different ion species and doses using the mask M, it is possible to form the third impurity region 50 around the source/drain region (S/D). The third impurity region 50 is of the same conductivity type as and lower in impurity concentration than the source/drain regions (S/D). The doping conditions are, for example, arsenic or phosphorus as ion species, 20 to 40 keV as energy and $1 \times 10^{13}$ cm$^{-2}$ to $1 \times 10^{14}$ cm$^2$ as dose.

The doping step is followed by the heating step adapted to activate the impurities, thus completing the solid-state imaging device according to the present embodiment as illustrated in FIGS. 1 and 3.

It should be noted that, although the transistors were used as an example of active elements in the solid-state imaging device and manufacturing method of the same according to the present embodiment, the present embodiment is applicable not only to transistors but also to, for example, diodes adapted to handle the charge generated by the photoreceiving region 10.

<3. Electronic Equipment>

Figure 8:
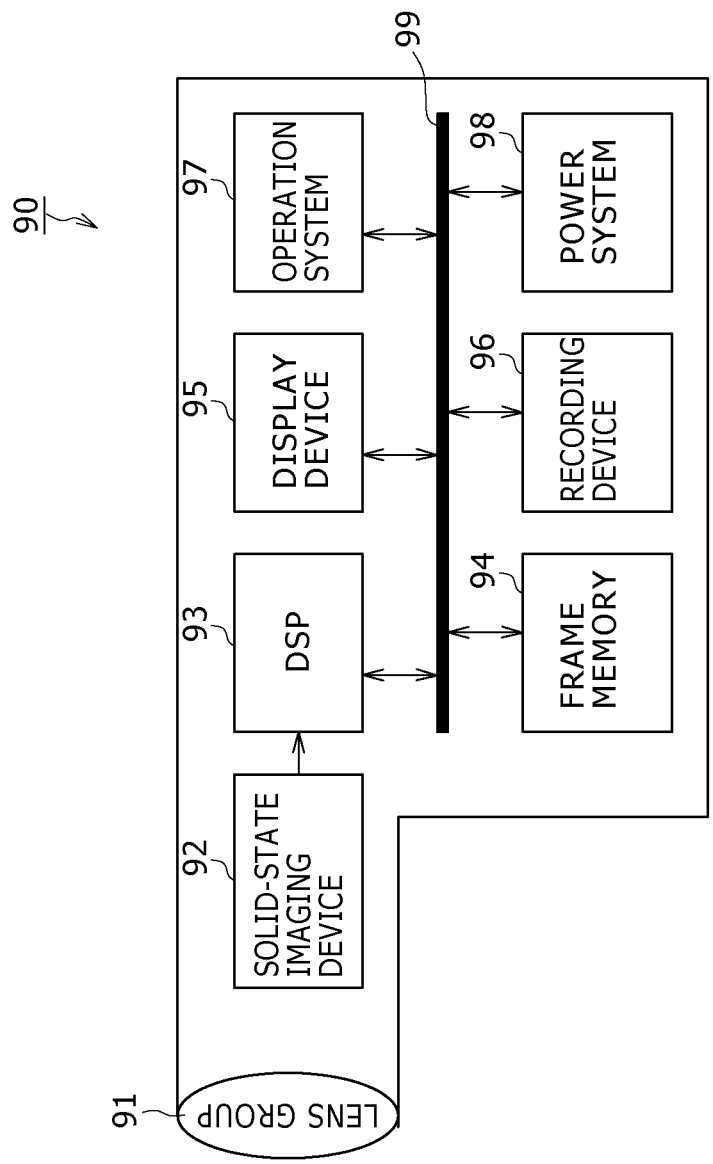
FIG. 8 is a block diagram illustrating a configuration example of electronic equipment according to the present embodiment.

FIG. 8 is a block diagram illustrating a configuration example of electronic equipment according to the present embodiment. As illustrated in FIG. 8, an imaging device 90 includes an optical system made up of a lens group 91, a solid-state imaging device 92, DSP (Digital Signal Processing) circuit 93, i.e., camera signal processing circuit, frame memory 94, display device 95, recording device 96, operation system 97, power system 98 and other components. Of these components, the DSP circuit 93, frame memory 94, display device 95, recording device 96, operation system 97 and power system 98 are connected to each other via a bus line 99.

The lens group 91 captures the incident light (image light) from the subject to form an image on the imaging surface of the solid-state imaging device 92. The solid-state imaging device 92 converts the amount of incident light, used by the lens group 91 to form the image on the imaging surface, into an electric signal and outputs the electric signal as a pixel signal. The solid-state imaging device according to the present embodiment described above is used as the solid-state imaging device 92.

The display device 95 includes a panel display device such as liquid crystal or organic EL (electro luminescence) display device and displays a moving or still image captured by the solid-state imaging device 92. The recording device 96 records the moving or still image captured by the solid-state imaging device 92 to a recording medium such as non-volatile memory, video tape or DVD (Digital Versatile Disk).

The operation system 97 issues operational instructions for a variety of functions of the imaging device in response to the user operation. The power system 98 supplies different kinds of power sources to the DSP circuit 93, frame memory 94, display device 95, recording device 96 and operation system 97 as appropriate.

The imaging device 90 configured as described above is applied to video cameras, digital still cameras and camera modules for mobile devices such as mobile phones. It is possible to provide an imaging device offering high image quality with minimal noise by using the solid-state imaging device according to the present embodiment as the solid-state imaging device 92.

The present application contains subject matter related to that disclosed in Japanese Priority Patent Application JP 2009-054353 filed in the Japan Patent Office on Mar. 9, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
    active elements configured to handle charges captured in a photoreceiving region, wherein at least one of the active elements is a transistor;
    an element isolation region configured to isolate the active elements;
    a first impurity region surrounding the element isolation region;
    a second impurity region between the first impurity region and the active elements and having an impurity concentration lower than that of the first impurity region; and
    a third impurity region surrounding at least one of a source and a drain of the transistor, wherein the first impurity region separates the element isolation region from at least the second impurity region and the third impurity region.

2. The solid-state imaging device of claim 1, wherein one of the active elements is a transistor adjacent to a doped section configured to convert the charge captured in the photoreceiving region to a voltage.

3. The solid-state imaging device of claim 1, wherein the active elements are transistors adjacent to the photoreceiving region.

4. Electronic equipment comprising:
    a solid-state imaging device configured to output an electric signal according to the amount of light received; and
    a signal processor configured to process the electric signal output from the solid-state imaging device, the solid-state imaging device including:
        active elements configured to handle charges captured in a photoreceiving region, wherein at least one of the active elements is a transistor;
        an element isolation region configured to isolate the active elements;
        a first impurity region surrounding the element isolation region;

a second impurity region between the first impurity region and the active elements and having an impurity concentration lower than that of the first impurity region; and a third impurity region surrounding at least one of a source and a drain of the transistor, wherein the first impurity region separates the element isolation region from at least the second impurity region and the third impurity region.

5. The electronic equipment of claim 4, wherein one of the active elements is a transistor adjacent to a doped section configured to convert the charge captured in the photoreceiving region to a voltage.

6. The electronic equipment of claim 4, wherein the active elements are transistors adjacent to the photoreceiving region.

7. The solid-state imaging device of claim 1, wherein the element isolation region is spaced apart from the second impurity region and the third impurity region.

8. The electronic equipment of claim 4, wherein the element isolation region is spaced apart from the second impurity region and the third impurity region.

* * * * *